United States Patent [19]

Drennen

[11] Patent Number: 5,740,528

[45] Date of Patent: Apr. 14, 1998

[54] PLANAR TRIPLY-BALANCED MICROSTRIP MIXER

[75] Inventor: William J. Drennen, Abington, Pa.

[73] Assignee: Tracor Aerospace Elecronic Systems, Inc., Lansdale, Pa.

[21] Appl. No.: 449,158

[22] Filed: May 24, 1995

[51] Int. Cl.$^6$ .................................................. H04B 1/26
[52] U.S. Cl. ........................ 455/327; 455/330; 455/319; 333/26
[58] Field of Search ............................. 455/317, 318, 455/319, 323, 325, 326, 327, 330, 333; 333/26, 109, 117, 125, 118, 128, 136; 257/724, 725

[56] References Cited

U.S. PATENT DOCUMENTS

| | | | |
|---|---|---|---|
| 3,611,153 | 10/1971 | Paul | 325/446 |
| 4,063,176 | 12/1977 | Milligan et al. | 325/446 |
| 4,125,810 | 11/1978 | Pavio | 455/327 |
| 4,249,263 | 2/1981 | Shinkawa et al. | 455/327 |
| 4,281,293 | 7/1981 | Childs et al. | 455/327 |
| 4,460,887 | 7/1984 | Sterns | 333/26 |
| 4,603,436 | 7/1986 | Butler | 455/326 |
| 4,675,911 | 6/1987 | Sokolov et al. | 455/325 |
| 4,973,972 | 11/1990 | Huang | 333/26 |
| 5,175,885 | 12/1992 | Lange et al. | 455/326 |
| 5,265,266 | 11/1993 | Trinh | 455/326 |
| 5,361,050 | 11/1994 | Einbinder | 333/204 |
| 5,428,840 | 6/1995 | Sadhir | 455/333 |

OTHER PUBLICATIONS

Watson Johnson Co., Catalog, pp. 747–765, date unknown.

*Primary Examiner*—Curtis Kuntz
*Assistant Examiner*—Sam Bhattacharya
*Attorney, Agent, or Firm*—Seidel, Gonda, Lavorgna & Monaco, PC

[57] ABSTRACT

A planar triply-balanced microstrip mixer for microwave and millimeter wave operation includes an RF port, and IF port and an LO port. The mixer is constructed on a single side of a two-sided substrate. The single side of the substrate supports an RF balun network connected to the RF port, an IF balun network connected to the IF port, and an LO balun network connected to the LO port; a pair of crossover diode ring quad circuits arranged in a planar back-to-back configuration; and a planar microstrip feed network connecting the RF, IF, and LO ports to the diode ring quad circuits through the RF, IF and LO balun networks.

12 Claims, 4 Drawing Sheets

PLANAR TRIPLY-BALANCED MICROSTRIP MIXER

FIELD OF THE INVENTION

The present invention relates to microwave circuits, and in particular to a triply-balanced microwave mixer circuit which is realized in a fully planar construction.

BACKGROUND OF THE INVENTION

A mixer is a critical component of modern radio-frequency (RF) systems. It is usually the first or second device after the RF input, so the mixer is crucial to the operation of the system. Various mixer parameters, such as bandwidth and interport isolation, must be optimized to produce devices capable of performing in modern RF systems.

A mixer converts RF power at one frequency into power at a different frequency. One reason this conversion is done is in order to make signal processing easier and less expensive. Changing the frequency of a signal without altering its information content is necessary because signal processing components, such as amplifiers, are much less expensive and work better when they are designed to operate at lower frequencies.

Another reason for frequency conversion, perhaps even the most important reason, is to allow for the practical transmission of low-frequency information (such as audio information) through space. Transmitting audio frequency (up to 20 Khz) signals directly would require antennas of impractically large size because of the relatively long wavelengths of audio signals. However, if the audio signals are first converted up in frequency to be centered around a much higher carrier frequency, antennas of practical size can be utilized. At the receiving end, it is necessary to capture part of the electromagnetic energy of the transmitted signal and reconvert it back down to the audio frequency range in order to extract the original low-frequency information. Thus, both transmission and receiving require an input signal to be converted. This conversion is done by "mix."

Mixing an input signal with a local oscillator (LO) signal yields upper and lower sidebands around the LO frequency. Each sideband has the same information content as the input signal. The upper sideband is the sum of the input and LO frequencies, while the lower sideband is the difference between the input and LO frequencies. Usually, it is the lower sideband (the "downconverted" signal) which is used in receiving systems, whereas the upper sideband (the "upconverted" signal) which is used in transmission systems. The upper or lower sideband, whichever is chosen, is called the intermediate frequency, or IF, signal.

There are basically four types of mixers: single-ended, single-balanced, doubly-balanced, and double doubly-balanced (also called triply-balanced). However, all types are three-port devices, and comprise an input port (the RF port), a local oscillator input port (the LO port), and an output port (the IF port). Single-ended mixers are the simplest type, and are realized using only a single diode. The LO, RF and IF ports are electrically the same, and are separated only by filters to provide some degree of interport isolation. Single-ended mixers, however, have a narrow bandwidth, limited dynamic range, and poor interport isolation.

Broader bandwidths and better isolation can be obtained with a singly-balanced mixer. A singly-balanced mixer consists of two single ended mixers. The mixer is fed by the LO signal through a balun which balances the diodes and connects them with the unbalanced LO input. Doubly-balanced mixers are so called because they have two baluns instead of just one, and comprise two singly-balanced mixers. This enables interport isolation both between the LO and RF ports and between the LO and IF ports. Doubly-balanced mixers use twice the number of diodes (four) as a singly-balanced mixer, and the diodes are usually, although not always, arranged in a diode "quad" ring configuration.

Triply-balanced mixers are so called because, in addition to baluns on the RF and LO ports, the IF port is also balanced. A triply-balanced mixer requires twice the number of diodes (eight) as a doubly-balanced mixer, and a triply-balanced mixer is usually realized by combining two diode quad ring mixers. The number of circuit nodes and conductors naturally rises commensurately. Triply-balanced mixers thus engender complex circuit topographies. At low frequencies, it is not a difficult problem to realize a triply-balanced mixer.

Practical difficulties arise, however, when trying to design triply-balanced mixers for operation in the microwave (2–18 GHz) and K/Ka bands (18–44 GHz). The two diode quads are required to be connected together at the IF tap points. It is critical at microwave and millimeter wave frequencies for this attachment to be made in as close proximity as possible, with minimal parasitics and conductor length. At those frequencies, conductor length and spacing become crucial. Some prior methods of connecting the two diode quads required either specially-developed diode quad devices or alignment of two diode quad packages on opposite sides of a suspended substrate, joining the two packages together by via holes through the substrate. Other prior methods required special diode quad packages suspended between two substrates, also suspended, and required precise orthogonal orientation between the two substrates and careful wiring connections between the substrates and the diode quads.

There is a need for a triply-balanced mixer which can operate at microwave and millimeter wave frequencies and which can be realized using microstrip hybrid circuit construction. Microstrip construction is inexpensive compared to previous methods of constructing triply-balanced mixers, and provides ease of assembly and rugged construction. Moreover, there is a need for a triply-balanced mixer which can be fabricated on only one side of a substrate, and which does not require suspending the substrate, or locating the substrate in complex spatial orientations. The present invention fills that need with a unique design that allows a triply-balanced structure to be realized on a single side of a single microstrip substrate to achieve a completely planar triply-balanced mixer. As an additional advantage, the present invention provides a design which is much less complex than existing triply-balanced designs, and which is even less complex than existing doubly-balanced mixer designs.

SUMMARY OF THE INVENTION

The present invention is a planar triply-balanced microstrip mixer for microwave and millimeter wave operation comprising an RF port, and IF port and an LO port. The mixer is fabricated on a single side of a two-sided substrate. The single side of the substrate supports an RF balun network connected to the RF port, an IF balun network connected to the IF port, and an LO balun network connected to the LO port, a pair of crossover diode ring quad circuits arranged in a planar back-to-back configuration, and a planar microstrip feed network connecting the RF, IF, and LO ports to the diode ring quad circuits through the RF, IF and LO balun networks. The balun networks are all realized using microstrip construction. Preferably, the balun networks each comprise a three stage Wilkinson power divider with two Lange couplers terminating each output port of the Wilkinson power divider.

DESCRIPTION OF THE DRAWINGS

For the purpose of illustrating the invention, there is shown in the drawings a form which is presently preferred; it being understood, however, that this invention is not limited to the precise arrangements and instrumentalities shown.

DESCRIPTION OF THE INVENTION

Figure 1:
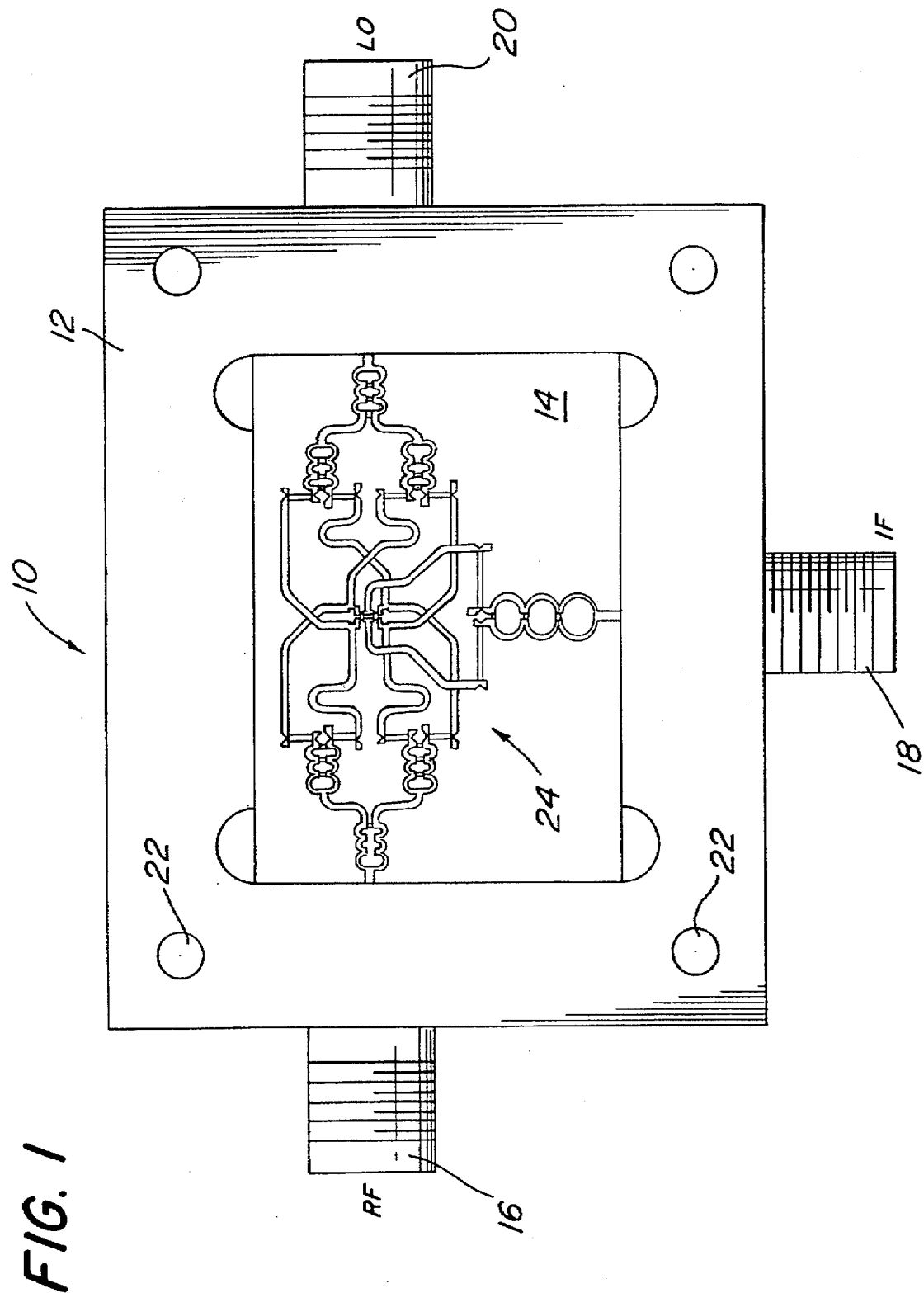
FIG. 1 is a top plan view of a mixer according to the invention, shown mounted in a package from which the lid has been removed for illustrative purposes.

Referring now to the drawings, wherein like numerals indicate like elements, there is shown in FIG. 1 a triply-balanced mixer according to the present invention. Mixer 10 comprises a package 12 containing a substrate 14 on which is formed the mixer circuitry. Package 12 is provided with three signal ports, namely a radio frequency (RF) port 16, an intermediate frequency (IF) port 18, and a local oscillator (LO) port 20. Package 12 is also provided with a number of tapped holes 22 which enable a lid (removed for clarity) to be attached to package 12. The lid would normally be hermetically sealed to package 12, such as by brazing or welding, for example. Package 12 and substrate 14 are made from conventional materials commonly used for this type of circuit. For example, package 12 may be made of an alloy known as Kovar, which is widely used in this field. Substrate 14 may be aluminum oxide, for example, which is also widely used as a substrate for thin and thick film microcircuits. Substrate 14 supports the mixer circuit 24, which is fabricated preferably using thin-film microcircuit techniques. Mixer circuit 24 and its physical realization will be described in greater detail below.

Figure 2A:
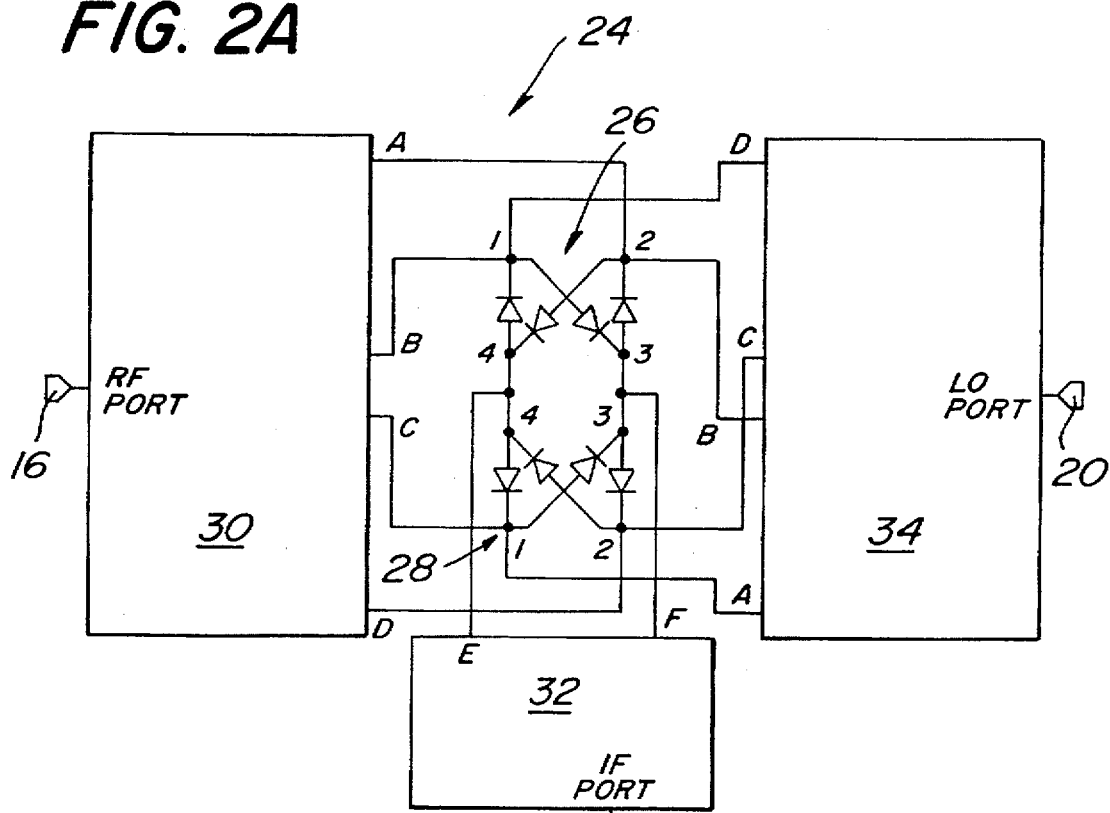
FIG. 2A is a schematic diagram, greatly simplified, of the triply balanced mixer according to the invention generally the RF, IF, and LO baluns.
Figure 4:
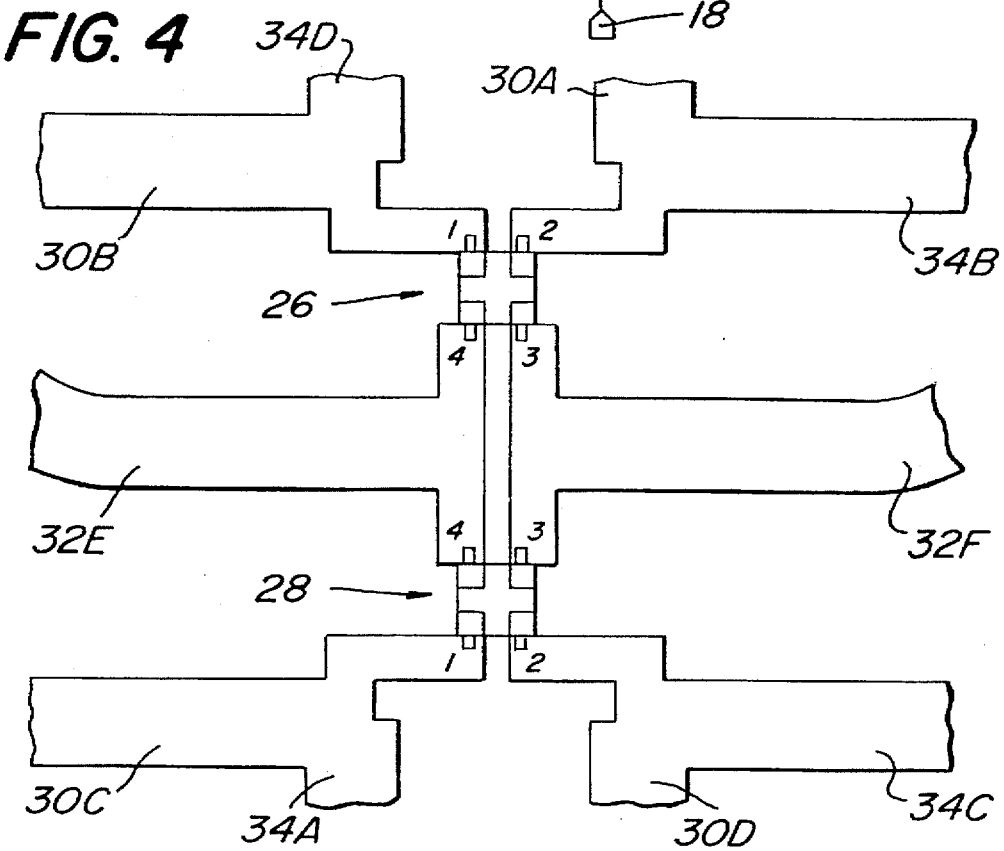
FIG. 4 is an enlarged view of a portion of FIG. 3, showing the crossover diode ring quad circuits in greater detail.
Figure 2B:
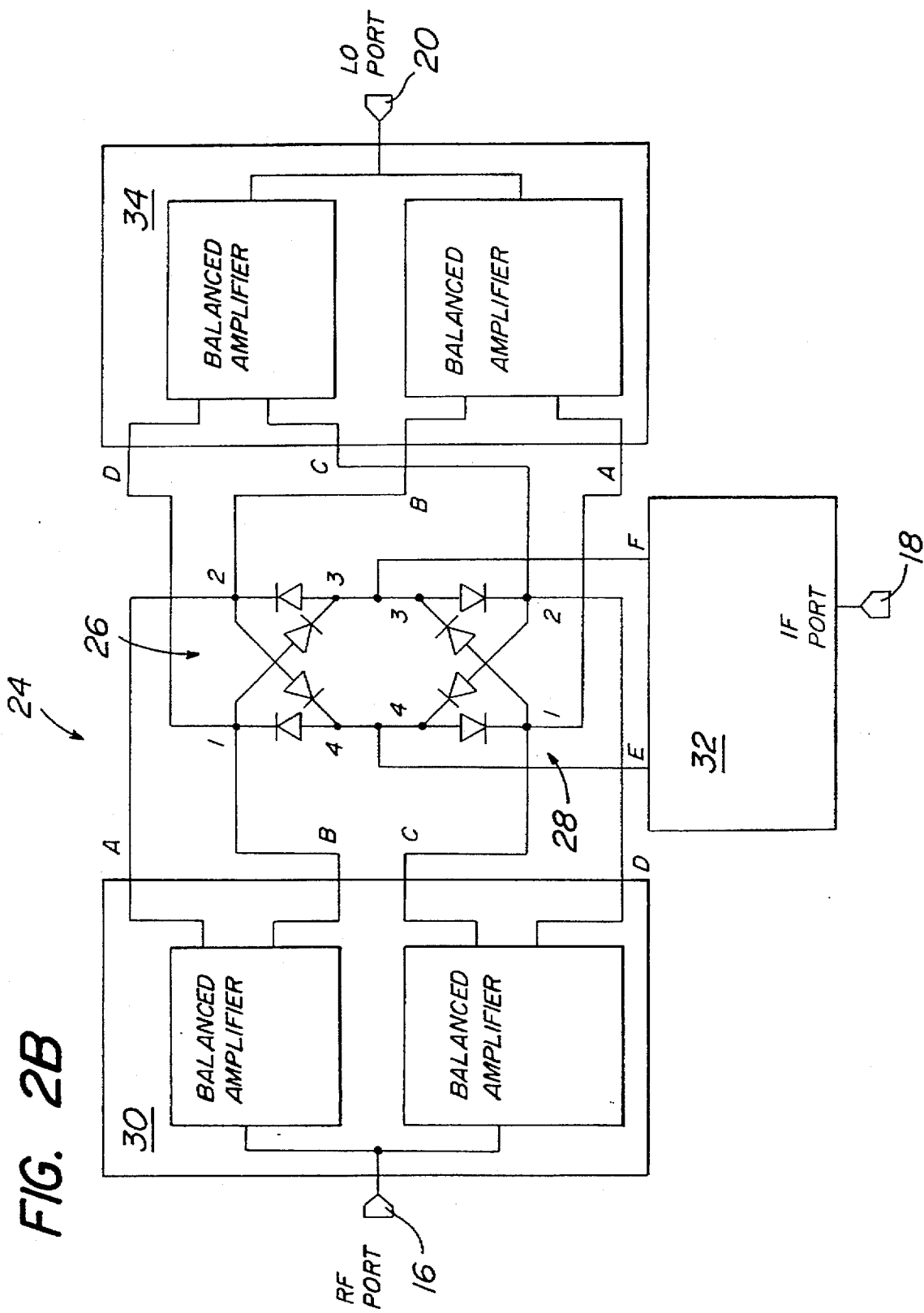
FIG. 2B is a schematic diagram, greatly simplified, of the triply balanced mixer according to the invention, in which the RF and IF baluns are balanced amplifiers.

Mixer circuit 24 is illustrated in greatly simplified form in FIG. 2. Each of the diode quads 26 and 28 has four terminals, numbered 1, 2, 3, and 4, as best seen in FIG. 4. Terminals 1 and 2 are located on opposite sides of the diode quad package from terminals 3 and 4. Terminals 1 and 2 are referred to herein as the "front end" of the diode quads 26 and 28, and terminals 3 and 4 are referred to as the "back end" of diode quads 26 and 28. As shown in FIG. 4, diode quads 26 and 28 are connected together with terminals 3 and 4 of diode quad 26 being connected to terminals 3 and 4, respectively, of diode quad 28. Thus, diode quads 26 and 28 are said to be connected in a "back-to-back" configuration. The back-to-back configuration insures that the length of the conductors between the two diode quads 26 and 28 is minimized, which reduces problems with phase shift and the electrical length of the conductors between the diode quads. As those skilled in the art will understand, a triply-balanced mixer typically employs two diode quad ring mixers, which are fed from three baluns 30, 32, and 34, each balun corresponding to one of the RF, IF and LO ports. Baluns are necessary to transform an unbalanced line, such as a coaxial cable or microstrip, to a balanced line having two outputs, the outputs being equal in magnitude and 180° out of phase. In mixer circuits, baluns are important because balanced signals help achieve broadband interport isolation and cancellation of spurious signals.

The present invention permits the realization of the triply-balanced mixer circuit 24, as shown in FIG. 2A, in a fully planar configuration, i.e., one which can be fabricated on a single side of substrate 14. Topographically, circuit 24 comprises a plurality of thin-film signal conductors arranged on substrate 14. Those skilled in this art will understand how thin-film microcircuits are constructed. This is made possible by realizing the baluns in a unique manner, and by combining the unique baluns with two crossover diode ring quad circuits 26 and 28.

Figure 3:
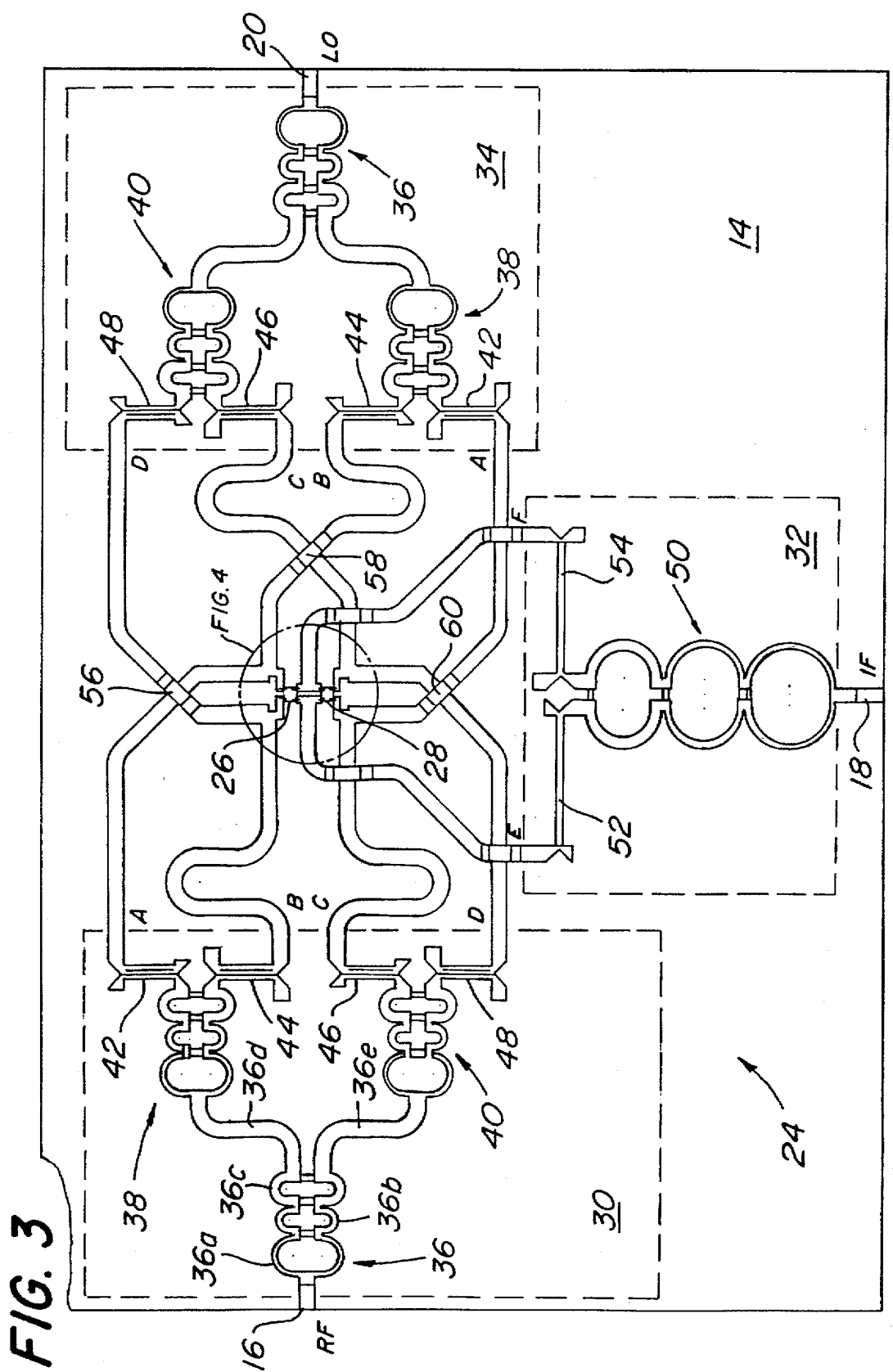
FIG. 3 is an enlarged view of the mixer of FIG. 1, showing the planar topography of the mixer in more detail.

Referring now to FIG. 3, the elements of mixer circuit 24 are shown in greater detail. RF balun 30 and LO balun 34 are essentially identical, and thus only the RF balun 30 will be described in detail. It will be understood that the description of RF balun 30 applies as well to LO balun 34.

The input signal to the balun from the signal port is received at the input of a first Wilkinson power divider 36. A Wilkinson power divider is known per se, and a planar realization of a Wilkinson divider for use in a balanced circuit is described by J. Rogers, et at., in "A 6 to 20 GHz Planar Balun Using a Wilkinson Divider and Lange Couplers," IEEE MTT-S Digest, 865 (1991). Wilkinson divider 36 has three sections, 36a, 36b, and 36c, which provide well-balanced, equal amplitude in-phase signals at outputs 36d and 36e. Each output 36d and 36e is connected to a further Wilkinson divider 38 and 40, respectively.

The outputs of Wilkinson dividers 38 and 40 feed a respective one of four Lange couplers 42, 44, 46, and 48. The Lange coupler 48 is realized in what is known as an unfolded configuration, and provides the necessary 180° phase shifted outputs from each of the Wilkinson dividers 38 and 40. A planar realization of unfolded Lange couplers is also described by Rogers, et al. The required 180° phase shift is created by terminating the coupled and through ports of the Lange couplers with open and shorted stubs and taking the outputs from the isolated ports. Thus, baluns 30 and 34 have two pairs of signal outputs, labeled A and B and C and D, respectively, in FIG. 3. Each pair of outputs A,B and C,D has equal amplitude but 180° phase-shifted signals. These signals are fed to diode ring quad circuits 26 and 28.

The IF balun 32 comprises a single Wilkinson power divider 50, with each output of the Wilkinson divider 50 feeding an unfolded Lange coupler 52 and 54, respectively. The output of IF balun 32 is a balanced signal at ports E and F, with the signals being of equal amplitude but 180° out of phase. These signals are also fed to diode ring quad circuits 26 and 28.

Referring now to FIG. 4, diode ring quad circuits 26 and 28 and their connections to the output ports of baluns 30, 32, and 34 are shown in more detail. Preferably, diode ring quad circuits 26 and 28 are monolithic crossover diode ring quads. Suitable monolithic crossover diode ring quads are sold commercially by Metelics Corporation. Each of diode ring quad circuits 26 and 28 has four beam-lead terminals, numbered 1 through 4. The electrical relationship between the terminals and the output ports of the three baluns is illustrated schematically in FIG. 2A. As can be seen by comparing FIGS. 2A and 4, the mixer circuit can be realized by simply locating the diode ring quad circuits 26 and 28 as shown relative to conductors 30A through 30D, 32E and F, and 34A through D, which are connected to the corresponding balun output ports.

It is important to note that the mixer circuit 24 has been realized without any crossovers in the area of the diode ring quad circuits 26 and 28. The only crossovers in that area are within the diode package themselves. If crossover diodes were not used, crossovers in the signal conductors in the area of the diodes would be necessary, and would produce negative parasitic effects. In addition, and even more importantly, the use of crossover quads allows the two diode rings to be joined together at the IF tap points with a minimal spacing between rings. If crossover diodes were not used, a schematically correct layout with proper feeds from all baluns would require a much greater spacing between diode rings. This would, in turn, cause a long electrical length between diode rings at the connecting points. Minimizing this electrical length between diode connection points is critical for triply-balanced mixers, since the double ring quad circuit must operate as one diode network with both rings in sync with each other and with respect to all three mixer ports. This limitation has, in the past, led to three dimensional mixer designs built around a three dimensional double diode quad package. The use of crossover diode quads, as explained, allows for a planar double diode quad circuit to operate in sync and in balanced mode over the entire band of interest. The circuit minimizes the electrical length between connection points and minimizes stray parasitics which would be caused if external crossovers were required near the diode circuit. While crossovers are used on other parts of the mixer circuit, such as at locations 56, 58 and 60, for example, the effect of the added length in the signal conductors can be easily compensated for, so that the signals arrive at the diode ring quad circuits 26 and 28 with the proper phase relationship. It is much easier to compensate for crossovers remote from the diode ring quad circuits 26 and 28 than it is to compensate for crossovers in the immediate vicinity of circuits 26 and 28.

Those skilled in the art will recognize that the mixer according to the present invention may be realized using other fabrication techniques, and other combinations of fabrication techniques. For example, instead of using two discrete diode ring quad circuits, a single monolithic double diode ring quad circuit may be employed. In that event, the single monolithic circuit would contain all eight required diodes, internally interconnected as required to realize two diode ring quad circuits on a single monolithic substrate.

It is also within the scope of the invention to realize the balun networks using balanced amplifiers. Where it is desired to use balanced amplifiers, it may be most convenient to fabricate the entire mixer circuit using monolithic integrated circuit techniques. Such techniques lend themselves very well to the fabrication of active circuits such as amplifiers and to circuits such as diode ring quads, and offer a number of advantages which may be obtained using integrated circuit construction.

The present invention may be embodied in other specific forms without departing from the spirit or essential attributes thereof and, accordingly, reference should be made to the appended claims, rather than to the foregoing specification, as indicating the scope of the invention.

I claim:

1. A single plane triply-balanced microstrip mixer for frequencies from about 2 GHz and up, comprising (a) an RF port, and IF port and an LO port, (b) a two-sided substrate having in a single plane on a single side thereof an RF balun network connected to the RF port, an IF balun network connected to the IF port, and an LO balun network connected to the LO port, (c) a pair of crossover diode ring quad circuits arranged in a planar back-to-back configuration on said single side of said substrate, and (d) a planar microstrip feed network also on said single side of said substrate connecting the RF, IF, and LO ports to the diode ring quad circuits through the RF, IF and LO balun networks.

2. A planar triply-balanced microstrip mixer according to claim 1, wherein the balun networks are realized using microstrip construction.

3. A planar triply-balanced microstrip mixer according to claim 1, wherein the RF, IF, and LO balun networks each comprise a microstrip Wilkinson power divider having two output ports, each output port being in series with a microstrip Lange coupler.

4. A planar triply-balanced microstrip mixer according to claim 3, wherein the Wilkinson power divider is a three-stage divider.

5. A planar triply-balanced microstrip mixer according to claim 1, wherein the balun networks are realized using balanced amplifiers.

6. A planar triply-balanced microstrip mixer according to claim 1, wherein the crossover diode ring quad circuits comprise monolithic integrated beam lead circuits.

7. A planar triply-balanced microstrip mixer according to claim 1, wherein the balun networks and feed networks comprise thin-film conductors.

8. A single plane triply-balanced microstrip mixer according to claim 1, wherein the balun networks, the crossover diode ring quad circuits, and the feed networks are realized in a single plane on a single side of a single semiconductor substrate using monolithic integrated circuit construction.

9. A single plane triply-balanced microstrip mixer for frequencies from about 2 GHz and up, comprising (a) an RF port, and IF port and an LO port, (b) a two-sided substrate having in a single plane on a single side thereof a microstrip-construction RF balun network connected to the RF port, a microstrip-construction IF balun network connected to the IF port, and a microstrip-construction LO balun network connected to the LO port, each balun network comprising a Wilkinson power divider having two output ports, each output port being in series with a Lange coupler, (c) a pair of monolithic integrated crossover diode ring quad circuits arranged in a planar back-to-back configuration on said single side of said substrate, and (d) a planar microstrip-construction feed network also on said single side of said substrate connecting the RF, IF, and LO ports to the diode ring quad circuits through the RF, IF and LO balun networks.

10. A planar triply-balanced microstrip mixer according to claim 9, wherein the balun networks and feed networks comprise thin-film conductors.

11. A single plane monolithic integrated circuit triply-balanced microstrip mixer for frequencies from about 2 GHz and up, comprising
   (a) an RF port, and IF port and an LO port,
   (b) a semiconductor substrate having in a single plane on a single side thereof a microstrip-construction RF balun network connected to the RF port, a microstrip-construction IF balun network connected to the IF port, and a microstrip-construction LO balun network connected to the LO port, each balun network comprising a Wilkinson power divider having two output ports, each output port being in series with a Lange coupler,
   (c) a pair of crossover diode ring quad circuits arranged in a back-to-back configuration on said single side of said substrate, and
   (d) a microstrip-construction feed network also on said single side of said substrate connecting the RF, IF, and LO ports to the diode ring quad circuits through the RF, IF and LO balun networks.

12. A planar triply-balanced microstrip mixer according to claim 11, wherein the balun networks are realized using balanced amplifiers.

* * * * *